United States Patent [19]
Russell et al.

[11] 3,955,103
[45] May 4, 1976

[54] ANALOG SWITCH

[75] Inventors: Ronald W. Russell, Sunnyvale; Daniel D. Culmer, Santa Clara, both of Calif.

[73] Assignee: National Semiconductor Corporation, Santa Clara, Calif.

[22] Filed: Feb. 12, 1975

[21] Appl. No.: 549,195

[52] U.S. Cl. .............................. 307/251; 307/297; 307/304
[51] Int. Cl.² .................. H03K 17/66; H03K 17/68
[58] Field of Search ..................... 307/251, 297, 304

[56] References Cited
UNITED STATES PATENTS

| | | | |
|---|---|---|---|
| 3,448,293 | 6/1969 | Russell | 307/251 |
| 3,449,688 | 6/1969 | Brown | 307/251 X |
| 3,678,297 | 7/1972 | Takahashi | 307/251 |
| 3,720,848 | 3/1973 | Schmidt, Jr. | 307/251 |
| 3,764,921 | 10/1973 | Huard | 307/251 X |
| 3,825,778 | 7/1974 | Ahmed | 307/254 X |

OTHER PUBLICATIONS
Martin, "Bipolar-To-Mosfet Level Converter Circuit"; IBM Tech. Discl. Bull.; Vol. 11, No. 10, pp. 1272-1273; 3/1969.

*Primary Examiner*—John S. Heyman
*Assistant Examiner*—Larry N. Anagnos
*Attorney, Agent, or Firm*—Lowhurst & Aine

[57] ABSTRACT

An analog switching circuit employs a field effect transistor as a switching element and a regulation circuit for maintaining the bias on the FET constant with changes in the amplitude of an analog signal in the circuit being controlled. The regulation circuit includes a current source, a pair of elements for generating a voltage drop connected in parallel with one another and in series with the current source, and a circuit for maintaining the voltage drops in those circuit elements equal to one another. The circuit elements are connected in series with one another between the source and the gate of the FET, such that the bias on the FET remains constant. A control circuit is operative to disrupt the balance of currents in the circuit elements to cause the FET to become nonconductive.

5 Claims, 1 Drawing Figure

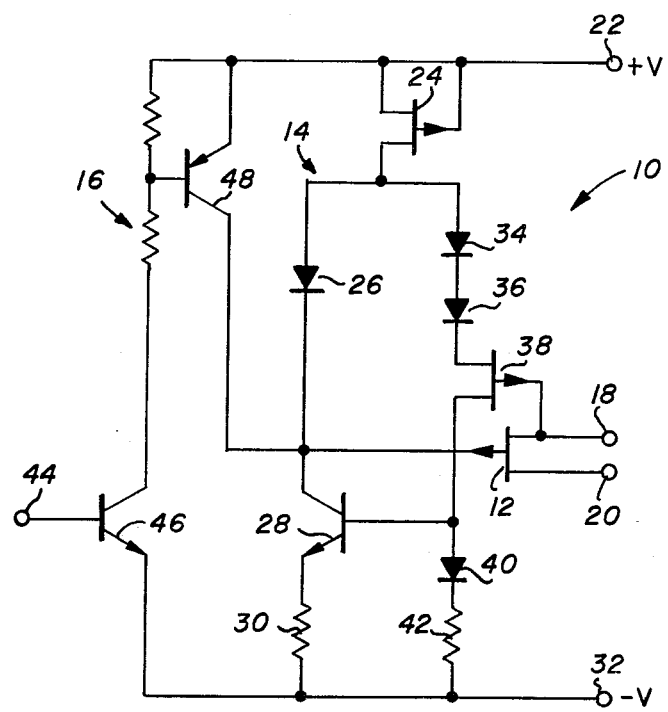

ANALOG SWITCH

BACKGROUND OF THE INVENTION

1. Field of the Invention

This invention relates generally to an analog switch and more particularly to a monolithic switch for controlling the connection of two points in an analog signal circuit.

2. Prior Art

Analog switches are employed for connecting two points in signal path to one another. Usually, such switches employ a semiconductor device which is connected between the two points. When the semiconductor device is rendered conductive, it completes a circuit between the two points, and when the device is rendered nonconductive, it opens the circuit between the two points. Semiconductor devices have a finite amount of resistance between their switching terminals while in their conducting state.

Since a switching semiconductor device is in the signal path which it is controlling, any change in the value of its resistance while it is in its conducting state will change the resistance of that signal path. Since the effective resistance of a semiconductor device changes with changes in the bias supplied thereto, any change in the amplitude of the analog signal which is being conducted therethrough should not alter this bias. However, since one of the switching terminals of the semiconductor device forms one of the terminals to which its biasing voltage is supplied, it is not possible to isolate the analog signal in the circuit being controlled from the bias supplied to the semiconductor device.

In an attempt to overcome the above mentioned problem, a switching circuit arrangement has been employed which includes a pair of MOS field effect transistors FET having their source electrodes connected together and their drain electrodes connected together in a parallel arrangement with such electrodes forming the switching terminals. By connecting the gate of one of the FET's to the positive supply of voltage and the gate of the other FET to the negative supply of voltage, any change in the amplitude of the signal in the circuit being controlled will increase the bias on one of those FET's and decrease the bias on the other FET. With an increase in the bias of one FET, its effective resistance in the circuit being controlled will decrease, and with a decrease in the bias of the other FET, its effective resistance in the circuit being controlled will increase. Since the effective resistance of the two FET's are connected in parallel, the total resistance presented to the circuit being controlled varies less than that of a single FET employed as the switching element. However, such variation of the parallel connected FET's produces an effective resistance which changes nonlinearly with changes in the amplitude of the analog signal in the circuit being controlled.

In an attempt to overcome the above mentioned problem, other known analog switching techniques attempt to maintain the bias on the switching device constant with the changes in the analog signal of the circuit being controlled. This has been accomplished, for example, by employing a resistor connected between the biasing terminals of the switching semiconductor device, such that the voltage on one of the terminals will tend to follow or tract the voltage of the other terminal, thereby maintaining the bias on the device substantially constant. However, this technique suffers from the problem of drawing a certain amount of current from the analog signal in the circuit which is being controlled to bias the switching semiconductor device. Any current which is drawn from the analog signal in the circuit which is being controlled will result in an error in that analog signal. If, for example, a resistor is connected between the source and the gate of a switching FET, the current through the biasing resistor will be drawn from the analog signal in the circuit being controlled, since it is connected to the source of the FET. That current which is drawn from the analog signal constitutes a transient loading of the signal path being controlled, since the current through the biasing resistor will charge the stray capacitance of the gate of the switching FET. Such transient loading of the signal path occurs, therefore, when the switching FET is rendered conductive.

The use of a biasing resistor also produces a transient loading problem when the switching device is rendered nonconductive. If, for example, a resistor is connected between the source and the gate of a switching FET having its source connected to a signal source and its drain connected to a load, in and which the source of the switching FET forms a common connection point between the signal source and a second load, an error current will be introduced into the second load when the switching device is rendered nonconductive. That is, when a reverse biasing signal is supplied to the device to render it nonconductive, that signal will change the potential of the common connection point between the signal source and the second load, thereby introducing an error current into the signal path between the signal source and the second load.

In order to reduce the transient loading which occurs when the switching device is rendered conductive, a relatively small biasing resistor is employed, such that the RC time constant with the stray capacitance on the gate of the FET is relatively small. To reduce the transient loading which occurs when the switching device is rendered nonconductive, a relatively large biasing resistor must be employed. Accordingly, if a particular circuit has both of the above mentioned transient problems, a compromise must be made between the use of a relatively small valued resistor and the use of a relatively large valued resistor.

The transient loading problem which occurs when the switching device is rendered nonconductive has been solved by the use of a second FET as the biasing resistance for the switching FET. In such an arrangement, the second FET has its source connected to the source of the switching FET and its drain connected to the gate of the switching FET. Transient loading of the signal path being controlled will result when the switching FET has been rendered conductive, due to the stray capacitance on its gate.

Although it is not known that other semiconductor devices have not been employed for sensing the change in the analog signal of the circuit being controlled to maintain the bias of the switching device constant, it can be appreciated that one would consider the use of a bipolar transistor to perform that function. However, if such a transistor is employed to sense a voltage differential of the analog signal in the circuit being controlled and to supply that differential to the other electrode of the biasing circuit of the switching device, a certain amount of current will be drawn from the signal path being controlled, which current will produce an error.

Accordingly, it can be appreciated that a need exist for an analog switching circuit in which the resistance of the switching element thereof in its conducting state will not vary with changes in the analog signal of the circuit being controlled. A need also exists for such a switching circuit which produces substantially zero dc loading in the signal path being controlled.

SUMMARY OF THE INVENTION

It is, therefore, an object of the present invention to provide an analog switching circuit in which the value of the resistance of the switching element in its conductive state does not vary with changes in the amplitude of the analog signal in the signal path which is being controlled.

Another object of the present invention is to provide an analog switching circuit which produces virtually zero dc loading in the signal path which is being controlled.

These and other objects of the present invention are attained by an analog switching circuit which includes a regulation circuit for maintaining the bias on a semiconductor switching element constant during variations in the amplitude of the analog signal in the signal path which is being controlled without drawing any current from that analog signal to maintain that bias constant. More particularly, the present invention employs a switching element in the form of an FET having its source connected to one of the points in the circuit being controlled and its drain connected to the other of the points in the circuit being controlled. Means are provided for maintaining the voltage between the source and the gate of that FET constant with variations in the amplitude of the analog signal in the circuit being controlled. This bias regulation means draws substantially no current from the source or the drain electrode of the FET to perform this function and, therefore, produces no dc loading on the signal path being controlled.

More specifically, the bias regulation means includes a first circuit element for supporting a voltage drop which is connected between a current source and the source electrode of the switching FET, a second circuit element for supporting a voltage drop which is connected between the current source and the gate electrode of the FET, and a circuit for maintaining those voltage drops equal to one another in the absence of an external voltage applied to the gate electrode of the FET, such that the source and gate electrodes of the FET remain at the same potential with variations in the amplitude of the analog signal in the signal path being controlled. Accordingly, in the absence of an external voltage applied to the gate of the FET, the FET is conducting to complete a circuit in the signal path being controlled. However, when an external voltage is supplied to the gate of the FET, the FET is rendered substantially nonconductive.

The above described circuit arrangement presents a substantially constant resistance to the signal path which is being controlled and virtually zero dc loading on that signal path.

These and other objects, features and advantages of the present invention, however, will be more fully realized and understood from the following detailed description, when taken in conjunction with the accompanying drawings, wherein:

BRIEF DESCRIPTION OF THE DRAWING

The single FIGURE is a schematic diagram of an analog switching circuit constructed in accordance with the principles of the present invention.

DETAILED DESCRIPTION OF THE PREFERRED EMBODIMENT

With reference to the single FIGURE, there is shown a switching circuit, generally designated with the reference numeral 10, which includes a switching element in the form of an FET 12 which is connected in the signal path which is being controlled. The switching circuit also includes a regulation circuit, generally designated with the reference numeral 14, and a control circuit, generally designated with the reference numeral 16. The source of the FET 12 is connected to a terminal 18 and the drain thereof is connected to a terminal 20, which terminals are effectively connected together when the FET is conducting and disconnected from one another when the FET is nonconducting. Therefore, the terminals 18 and 20 correspond to two points in an analog signal circuit or signal path which is being controlled by the conduction state of the FET 12.

The regulation circuit 14 is connected to the source and gate electrodes of the FET 12 and maintains a constant potential between those electrodes. A positive supply of voltage on a terminal 22 is connected to an FET 24 which functions as a current source by having its gate connected to it source. The drain of the FET 24, which constitutes the output of the current source, is connected through a diode 26, a transistor 28, and a resistor 30 to a terminal 32 having a negative supply of voltage thereon. The output of the current source 24 is also connected through diodes 34 and 36 to the source electrode of an FET 38. The drain of the FET 38 is connected through a diode 40 and a resistor 42 to the terminal 32. The base of the transistor 28 is connected to the anode of the diode 40 and the resistance value of the resistors 30 and 42 are equal to one another.

That portion of the circuit which includes the transistor 28, the diode 40 and the resistors 30 and 42 maintains the current supplied by the FET 24 equally divided between the circuit branch which includes the diode 26 and the circuit branch which includes the FET 38. More particularly, the base-emitter voltage of the transistor 28 is established by and is equal to the voltage drop across the diode 40. Accordingly, as is well known in such circuits, the current through the transistor 28 will be equal to the current through the diode 40.

If the current through the diode 26 is equal to the current through the diodes 34, 36 and through the FET 38, the voltage drop developed across the diode 26 will be equal to the voltage drop developed across the diode 34, to the voltage drop developed across the diode 36, and to the voltage drop from the gate to the source of the FET 38. Since the gate of the FET 38 is connected to the source of the FET 12, the voltage on the source electrode of the FET 12 will be equal to the voltage on its gate electrode if the current balance discussed above is not disturbed. More specifically, beginning from the source electrode of the FET, a voltage drop exists between the gate and source electrode of the FET 38 which is cancelled by a voltage rise on the diode 36. The voltage rise of the diode 34 is cancelled by the voltage drop on the diode 26, such that the gate electrode of the FET 12, which is connected to the diode 26 will remain at the same potential as the source electrode of the FET 12.

Since the bias voltage of the FET 12 is that voltage which is impressed between its source and gate electrodes, and since that voltage drop will remain constant in the absence of an external influence on the circuit 14, the resistance between the terminals 18 and 20 when the FET 12 is conducting will not vary with variations in the amplitude of the analog signal which is conducted therethrough from the circuit being controlled. Furthermore, the gate electrode of the FET 38 will draw virtually zero current from the terminal 18 and, therefore, from the analog signal in the circuit being controlled. Accordingly, the regulation circuit 14 and the FET 12 provide virtually zero dc loading in the signal path which includes the source-drain circuit of the FET 12.

The FET 12 is rendered nonconductive by supplying a voltage to its gate electrode which will be sufficient to alter the current balance described above which exists in the regulation circuit 14. Accordingly, if a positive voltage pulse is supplied to a terminal 44, a transistor 46 will be rendered conductive to render a normally nonconductive transistor 48 conductive. When the transistor 48 is rendered conductive, the positive supply voltage on the terminal 22 is connected to the gate electrode of the FET 12. Furthermore, the connection of the positive supply voltage to the collector of the transistor 28 will cause an imbalance of the above described balanced current conditions, thereby altering the source to gate potential on the FET 12 and rendering it nonconductive. It can be appreciated, however, that any control circuit can be employed in place of the circuit 16 to perform the same function.

It can be appreciated that the bias on the FET 12 remains constant while it is in its conducting state if the following conditions are considered. If it is assumed that the voltage on the terminal 18 increases in a positive direction, then the conduction of the FET 38 will decrease, thereby decreasing the current therethrough and through the diodes 34 and 36. Such a decrease in the current through the FET 38 will cause an increase in the current through the diode 26, thereby increasing the voltage on the gate of the FET 12.

During a negative voltage transition on the terminal 18, FET 38 tends to become more conductive, thereby increasing the collector current of transistor 28. This increase in the collector current causes a corresponding decrease of the voltage on the gate of the FET 12, thereby maintaining the desired regulation of the bias voltage thereon.

If it is assumed that the voltage on the terminal 18 increases drastically in a positive direction, then the current through the FET 38 will cease, thereby rendering the transistor 28 nonconductive. When the transistor 28 is rendered nonconductive, the voltage on its collector will increase rapidly and will charge the stray capacitance thereof through the diode 26. Since the collector of the transistor 28 is connected to the gate of the FET 12, the voltage on the gate of the FET 12 will also increase rapidly. Accordingly, the voltage on the gate of the FET 12 will follow or track the voltage on the source of the FET 12. Accordingly, the bias supplied to the FET 12 will remain constant with changes in the amplitude of the analog signal connected to the terminals 18 and 20. Therefore, the resistance presented to the circuit being controlled will remain constant with such variations in the amplitude of the analog signal. In addition, it can be appreciated that all of the current required to operate the FET 12 is derived from the positive supply voltage on the terminal 22, rather than from the analog signal on the terminals 18 and 20.

It can be appreciated that the FET 12 illustrated in the drawing and described above is a JFET. However, it is to be understood that a MOS FET can also be employed if sufficient level shifting is provided between its source and gate. Although such level shifting is not practical in a monolithic circuit, it is feasible in a circuit employing discrete components.

The invention claimed is:

1. An analog switch for connecting two points in a signal path, comprising
   a. a first FET having its source electrode connected to one of said points and its drain electrode connected to the other of said points in said signal path,
   b. a current source,
   c. first means for producing a voltage drop connected between said source electrode and said current source,
   d. second means for producing a voltage drop connected between said gate electrode and said current source,
   e. means connected to said first and to said second means for maintaining said voltage drops equal to one another in the absence of an external voltage applied to said gate electrode, such that the potential of said source electrode remains approximately equal to the potential on said gate electrode with variations in the amplitude of a signal applied at said points, and
   f. means for connecting such an external voltage to said gate to render said FET substantially nonconductive.

2. The analog switch of claim 1, wherein said first means includes a second FET having its gate electrode connected to the source electrode of said first FET, with a portion of the voltage drop of said first means existing between the gate electrode and the source electrode of said second FET.

3. The analog switch of claim 2, wherein said first means includes a first diode and a second diode connected in series with the source of said second FET and wherein said second means includes a third diode.

4. The analog switch of claim 3, wherein said maintaining means is disposed for maintaining the current in said first and second diodes and in said second FET equal to the current in said third diode.

5. The analog switch of claim 4, wherein said maintaining means includes a transistor having its collector-emitter circuit connected in series with said third diode and its base connected to the drain of said second FET, and a fourth diode connected across the base-emitter junction of said transistor.

* * * * *